United States Patent [19]
Cabot

[11] Patent Number: 5,420,516
[45] Date of Patent: May 30, 1995

[54] METHOD AND APPARATUS FOR FAST RESPONSE AND DISTORTION MEASUREMENT

[75] Inventor: Richard C. Cabot, Lake Oswego, Oreg.

[73] Assignee: Audio Precision, Inc., Beaverton, Oreg.

[21] Appl. No.: 97,064

[22] Filed: Jul. 23, 1993

Related U.S. Application Data

[63] Continuation of Ser. No. 764,142, Sep. 20, 1991, abandoned.

[51] Int. Cl.$^6$ ............................................. G01R 23/20
[52] U.S. Cl. ..................................... 324/620; 324/626; 324/624; 324/623; 324/576
[58] Field of Search ............... 324/624, 620, 613, 626; 379/6; 364/553, 485, 484, 576

[56] References Cited

U.S. PATENT DOCUMENTS

| | | | |
|---|---|---|---|
| 3,862,380 | 1/1975 | Hekimian | 324/624 |
| 4,028,622 | 6/1977 | Evans | 324/624 |
| 4,273,970 | 6/1981 | Favin | 324/624 |
| 4,774,454 | 9/1988 | Yamaguchi | 374/624 |

OTHER PUBLICATIONS

Belcher: "A New Distortion Measurement"—Wireless World May 1978—pp. 36–41.

Boyd: "Multitone Signals with Low Crest Factor"—IEEE Trans. on Circuits & Systems—Oct. 1986.
Boyd: "Measuring Volterra Kernels"—IEEE Trans. on Circ. & Systems—Aug. 1983.
Nicolet—660A Dual Channel FFT Analyzer—Descriptive brochure—1980 (5 pages).
Pendergrass: "A high resolution Low Frequency Spectrum Analyzer" HP Journal—Sep. 1978—pp. 2–13.

*Primary Examiner*—Kenneth A. Wieder
*Assistant Examiner*—Jose M. Solis
*Attorney, Agent, or Firm*—William A. Birdwell & Associates

[57] ABSTRACT

A method and apparatus for fast response and distortion measurement of a signal transfer device. A computer processor generates a multitone test signal of predetermined duration and stores it in a memory. The test signal is read out, converted to analog form, if necessary, and applied to the input of a device under test. The output produced by the device under test in response to the test signal is acquired and digitized, if necessary, and a Fast Fourier Transform is performed on the acquired data to determine its spectral characteristics. Frequency response, harmonic distortion, intermodulation distortion, phase distortion, wow and flutter and other signal transfer characteristics are measured by the CPU by analysis of the output signal.

4 Claims, 14 Drawing Sheets

METHOD AND APPARATUS FOR FAST RESPONSE AND DISTORTION MEASUREMENT

This is a continuation of application Ser. No. 07/764,142 filed Sep. 20, 1991, now abandoned.

BACKGROUND OF THE INVENTION

This invention relates to methods and apparatuses for quickly measuring response and distortion characteristics of a signal transfer device, and in particular, for measuring the signal transfer characteristics of an audio signal transfer device, such as an audio amplifier, a telephone channel, or the like.

In the sound reproduction, broadcast and telephone communications industries it is often necessary or desirable to determine the response and distortion characteristics of a signal transfer device in order to evaluate, repair or improve an audio signal transfer path. The transfer device may be any of many commonly known devices, such as a stereo sound reproduction amplifier (sometimes referred to as a "hi-fi" or "stereo" amplifier), a telephone communications channel or other communications link, a magnetic tape audio signal recorder, or audio signal broadcast equipment. What these devices have in common is that they accept as an input one or more audio frequency signals and reproduce them at their output, either immediately or delayed in time.

The conventional way of measuring response and distortion characteristics of such devices ordinarily has been to apply sequentially one or more known test tones, i.e., audio frequency sinewave signals whose frequencies are known, to the input of an audio signal transfer device and to measure their amplitude and relative phase, and the amplitude of their harmonics, at the output of the device. The tones are usually measured at the output using a bandpass filter whose center frequency is tuned to one of the input frequencies or a harmonic thereof. For example, to determine the frequency response of such a device, a number of tones are applied sequentially to the input and their amplitudes are measured at the output to obtain data representative of output amplitude as a function of frequency. Similarly, to measure harmonic distortion a known frequency is applied to the input of a device and the amplitudes of those harmonics of the input frequency which are present at the output are measured as an indication of harmonic distortion. Conventional testing with manually-operated equipment can take as much as an hour for a thorough evaluation. This can be reduced with computer-controlled equipment, but still requires a significant amount of time during which the device under test (hereinafter "DUT") cannot be used for normal activity. It is to be understood that the terms device or DUT used herein refer without limitation to one or more devices connected together.

A recognized international measurement standard has been adopted by the CCITT (International Consultative Committee on Telephone and Telegraph) and the EBU (the European Broadcasting Union) which employs two sequences of test tones, one for monophonic devices and one for stereo devices. The monophonic sequence lasts 31 seconds and the stereophonic sequence lasts 33 seconds. The sequence begins with a preamble which indicates which sequence is being sent and the originator of the test. The tones are one second in duration each, and an 8 second long pause is included for noise measurements. However, while this method has the advantage of being standardized, like other conventional test methods it is relatively time consuming; that is, it requires the device under test to be shut down from normal activity for a significant amount of time, thereby disrupting normal operations.

There are also devices known as real time analyzers that apply a white noise signal to the input of a DUT and provide an indication of the output amplitude at a number of frequencies by the simultaneous use of multiple bandpass filters tuned to those frequencies. The amplitudes of the outputs from those filters are displayed. However, those devices are limited in their usefulness in that they provide little information beyond frequency response, and they require time to average the noise signal at the various frequencies measured.

Thence, it can be seen that there has been a need for a method and apparatus for making thorough signal response and distortion measurements of signal transfer devices quickly, so as to take them out of service for a minimal amount of time.

SUMMARY OF THE INVENTION

The limitations of conventional response and distortion measurement methods and apparatuses are overcome in the present invention by a form of digital parallel processing of the test signal input to a DUT and the resultant output. A plurality of selected test tones are applied to the input of the DUT simultaneously. The output of the DUT is measured using a Fast Fourier Transform ("FFT") to convert the time domain output signal to the frequency domain, thereby permitting the amplitude, phase and frequencies of the output signal components to be determined.

After the type of test to be performed and the test tones are selected, the input test signal is created in digital form by a computer processor and stored in a digital memory. When the test is to be run, the digitized test signal is read out of memory and converted to analog form for input to the DUT, assuming that the DUT is not a digital audio signal processor. The output from the DUT is simultaneously acquired, converted to digital form (assuming that the device does not have a digital output) and stored in the digital memory. In this way, the test signal application and acquisition time can be reduced to the period of just a few repetitions of the test signal stored in memory. If the DUT is a digital audio signal processor, no digital to analog or analog to digital conversion is needed. A combination of analog and digital equipment may need only one digital to analog or analog to digital conversion.

Once the DUT output data is acquired, the DUT may be returned to normal operation, and computation of the FFT is performed to identify the amplitudes, phases and frequencies of the DUT output signal. Values for signal transfer characteristics such as frequency response, harmonic distortion, intermodulation distortion, phase distortion, wow and flutter, and channel separation in a stereo or other multichannel system can be computed from test information displayed and produced in numerical form or as a function of some parameter, such as frequency. In addition, the source of the test signal can be identified by the pattern, or signature, of the DUT output signal.

Accordingly, it is a principal objective of the present invention to provide a new and improved method and apparatus for measuring the signal transfer characteristics of a signal transfer device.

It is another objective of the present invention to provide a measurement method and apparatus that simultaneously applies a plurality of test tones to the device to be tested and transforms the output of the device to the frequency domain to identify the amplitudes, phases and frequencies of the components that make up the output signal.

It is a further objective of the present invention to provide a measurement method and apparatus that digitally generates an input signal comprising a plurality of test tones simultaneously applied to a device to be tested and converts the output of the device to digital form for analysis.

It is yet another objective of the present invention to provide a method and apparatus that permits the signal transfer characteristics of a signal transfer device to be determined in minimal time.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
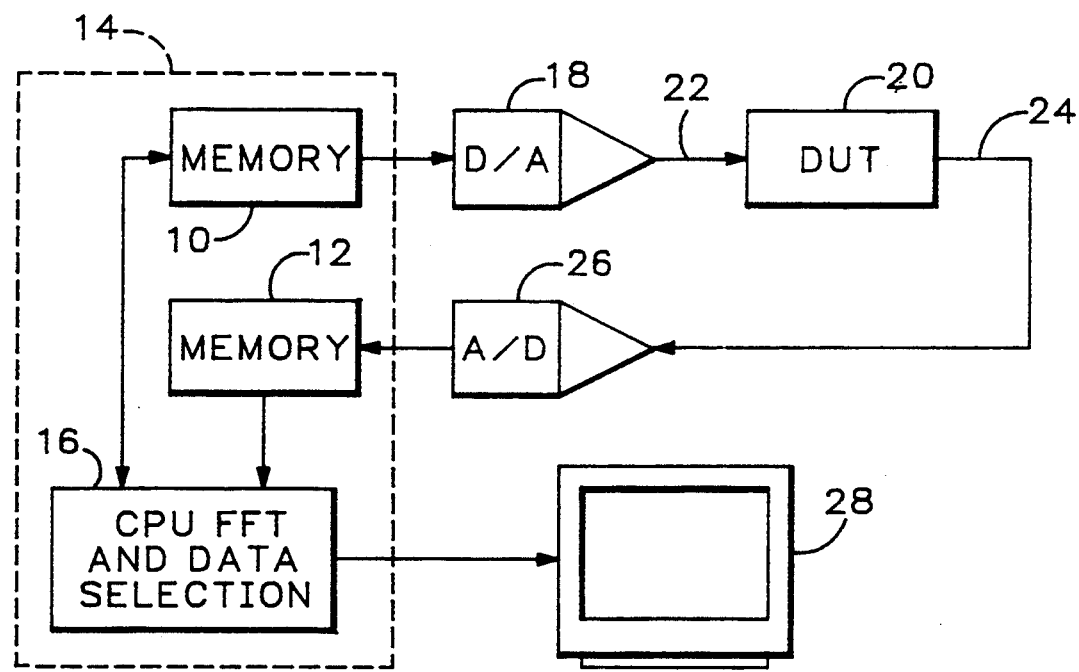
FIG. 1 is a block diagram of an apparatus according to the present invention.

A preferred embodiment of the present invention and its relationship with a device under test ("DUT"), is shown in FIG. 1. An apparatus according to the present invention preferably comprises an input memory 10 and an output memory 12, both of which preferably are random access memories which are part of a computer processor 14, and may be subdivisions of the same memory. The computer processor includes a central processing unit 16 (hereinafter "CPU") which is interconnected with memories 10 and 12 and programmed to carry out the functions of the present invention.

Under control of the CPU 16, the input memory 10 supplies to a digital to analog converter 18 stored data representing a digitized waveform to be provided to the input 22 of the DUT 20. The waveform is predetermined by the CPU in accordance with user specifications of amplitude, phase and frequency of the test tones, and stored in the input memory 10 for quick access during testing of the DUT. The digital to analog converter 18 converts the digitized waveform supplied by the input memory 10 to an analog signal for application to the input 22 of the DUT. The output 24 of the DUT is supplied to analog to digital converter 26 which digitizes that analog signal and stores it in output memory 12. The results of test computations made on that stored, digitized output data are displayed on a video monitor 28 or other suitable alphanumeric or graphical display device. This enables the test data to be acquired in minimal time so that the DUT can be returned to service in a negligible period of time, e.g., one second, after which the processing explained hereafter can take place. At the same time, it is to be recognized that the method and apparatus of the present invention as described herein could be implemented with other hardware and that the device under test could be a digital audio signal processor which would not require the digital to analog converter 18 or the analog to digital converter 26, or both, and that it could have a digital input with an analog output or an analog input with a digital output, without departing from the principles of this invention.

Figure 2:
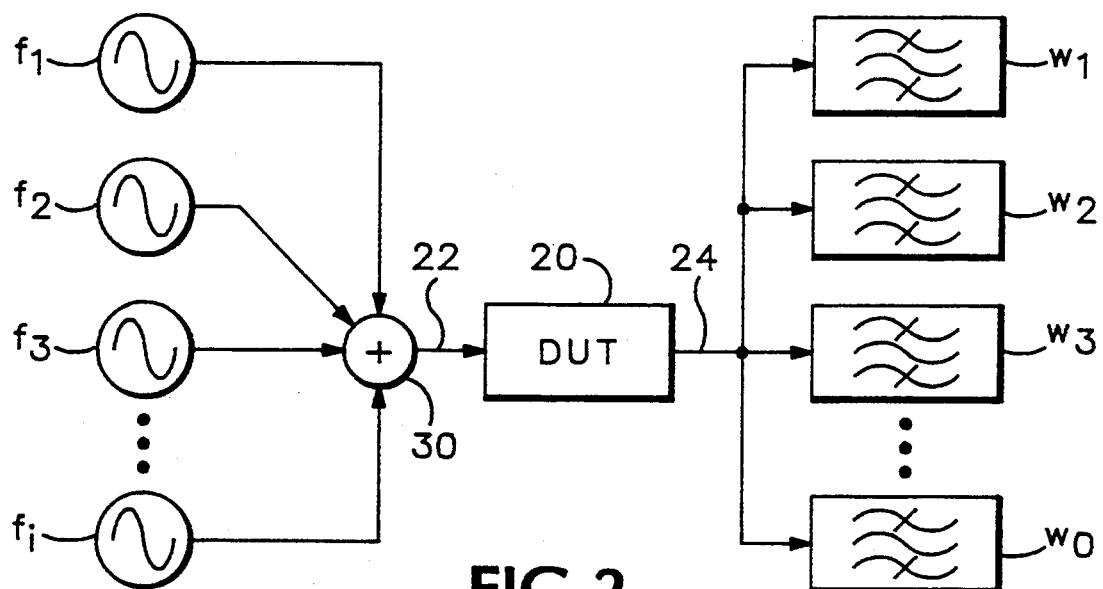
FIG. 2 is a schematic diagram of the basic principle of operation of the present invention.

The present invention employs a type of parallel processing by applying to the DUT 20 a plurality of sinusoidal test tones at once, as represented by $f_1$, $f_2$, $f_3$, and so on, up to $f_i$, in FIG. 2, where i is the number of distinct test tones applied to the device under test at once. These tones are added, as represented by symbol 30, and applied to the input 22 of the DUT 20. The output 24 of the DUT is measured and analyzed to determine the spectral characteristics, that is, the frequencies, phases and amplitudes of those frequencies which are components of the output waveform of the DUT. Those frequencies, which may be fewer, but generally are greater than the number of input frequencies, are represented by $w_1$, $w_2$, $w_3$ and $w_o$ in FIG. 2, where o represents the number of distinct frequencies found in the output waveform. By analyzing the frequencies, phases and amplitudes of the components that make up the output signal it can be determined whether there is harmonic distortion, intermodulation distortion, amplitude distortion, or phase distortion. The amount of noise present, the existence of wow and flutter, a change in speed of the signal as, for example, where a tape recorder is running too slow or too fast, and in the case of a multichannel system, the degree of separation of channels, can also be determined. The computer processor 14 may be programmed in any convenient way to perform the measurements set forth herein.

Figure 3A:
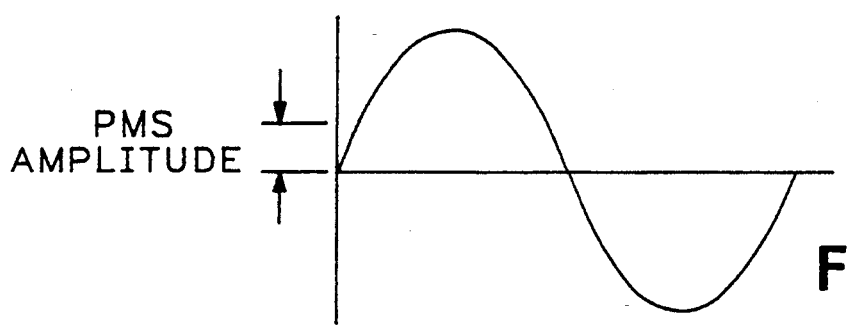
FIG. 3A is a plot of a typical sinusoidal waveform used in conventional response and distortion measurements.
Figure 3B:
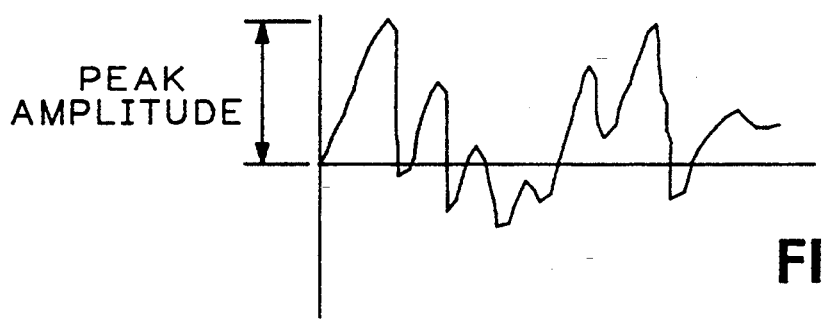
FIG. 3B is a plot of a typical DUT input waveform used in the present invention on the same relative amplitude scale as FIG. 3A.

While the type of signal typically applied to the input of a DUT in the prior art ordinarily comprises one, or perhaps two, sinusoidal signals as shown in FIG. 3A, the signal applied to the device under test in the present invention would ordinarily appear more or less like that shown in FIG. 3B, depending upon the specific frequencies, phases and amplitudes of the test signal frequencies $f_1$ through $f_i$.

Figure 4:
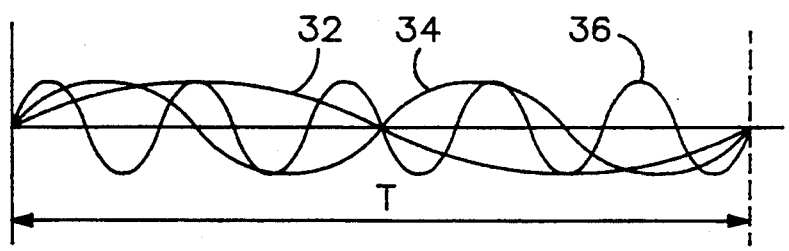
FIG. 4 is an illustration of three tone signal waveforms relative to a signal generation time block during which an output signal is acquired, a first one having a period equal to that time block and two others having periods that are integer multiples of the frequency of the first one.

Turning now to FIG. 4, the period T represents the time during which the input signal 22 to the DUT 20 completes one waveform repetition, and an integer sub-multiple of the time during which the output signal 24 of the DUT 20 is acquired in the method and apparatus of the present invention. That is referred to hereinafter as a signal generation time block or "generation block." Waveform 32 represents a generation block repetition frequency having the period T. Waveforms 34 and 36 represent two test tones, though there may be many more. The generation block repetition frequency is both the lowest frequency which can be generated and the closest possible spacing of the test tones. Each of the test tones is an integral multiple of the generation block repetition frequency; for example, test tone 34 is two times the generation block repetition frequency of waveform 32, and test tone 36 is five times the generation block repetition frequency of waveform 32. However, it is desirable that the test tones, and their harmonics, not be integral multiples of one another, because that would make identification of harmonic distortion at the output of the DUT more difficult.

The output measurement and analysis is accomplished preferably by sampling the DUT output in the time domain at a frequency at least twice as high as the highest frequency component to be measured at the output of the device under test, as dictated by the sampling theorem. As indicated above, the sample data is digitized, stored and operated on by the CPU 16. The preferred technique to be used is a Fast Fourier Transform ("FFT") which converts the time domain data to the frequency domain. However, other time domain to frequency domain transforms might also be used without departing from the principles of the invention. In the preferred embodiment of the invention, the DUT output signal is sampled at the same rate as the test signal samples applied to the output. This causes all frequency components in the signals to fall in the center of measurement FFT frequency bins. This technique is well known in the electrical engineering art, and many useful computer algorithms can be found to implement the technique.

The output is measured over a period referred to hereinafter as a measurement time block or "measurement block." The measurement block is an integer multiple of the generation block. The generation block period T is typically chosen so that the measurement block has a number of data samples equal to a power of 2, though this is not required for some FFT algorithms. The FFT yields one distinct measurable frequency for each pair of input samples. The minimum frequency resolution is equal to the sample rate divided by the number of distinct measurable frequencies. For example, for 16,384 input samples at a sample rate of 48,000 Hz, there will be 8,192 distinct measurable frequencies with a spacing of 2.93 Hz. Preferably the lowest test tone for most audio systems would be 20 Hz, or in the case of the aforementioned example, 17.58 Hz.

Figure 5:
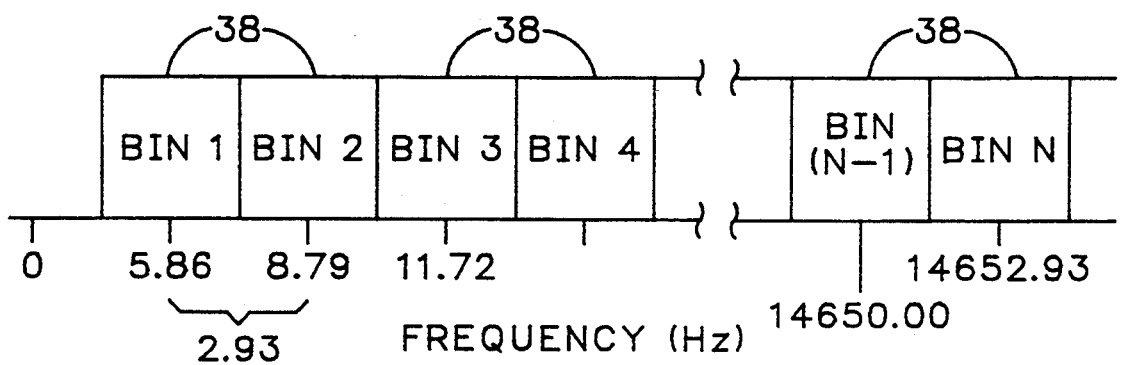
FIG. 5 is an illustration of a plurality of frequency subdivisions, or "bins," corresponding to the allowable frequencies that can be measured at the output of a DUT when using a Fast Fourier Transform according to the present invention.

Since a fixed number of points i in the time domain are acquired for analysis, the test tones may be generated digitally to exactly match the measurement block. Also, the frequency spectrum available to be measured at the output of the device under test may be conceptually divided into a finite number of frequencies that can be separately identified, referred to hereinafter as "bins" as shown at 38 in FIG. 5. Each bin is separated by the frequency equal to the highest resolution of the system. For example, if the block repetition frequency is 2.93 Hz, the center of each bin will be separated by that amount.

Figure 6A:
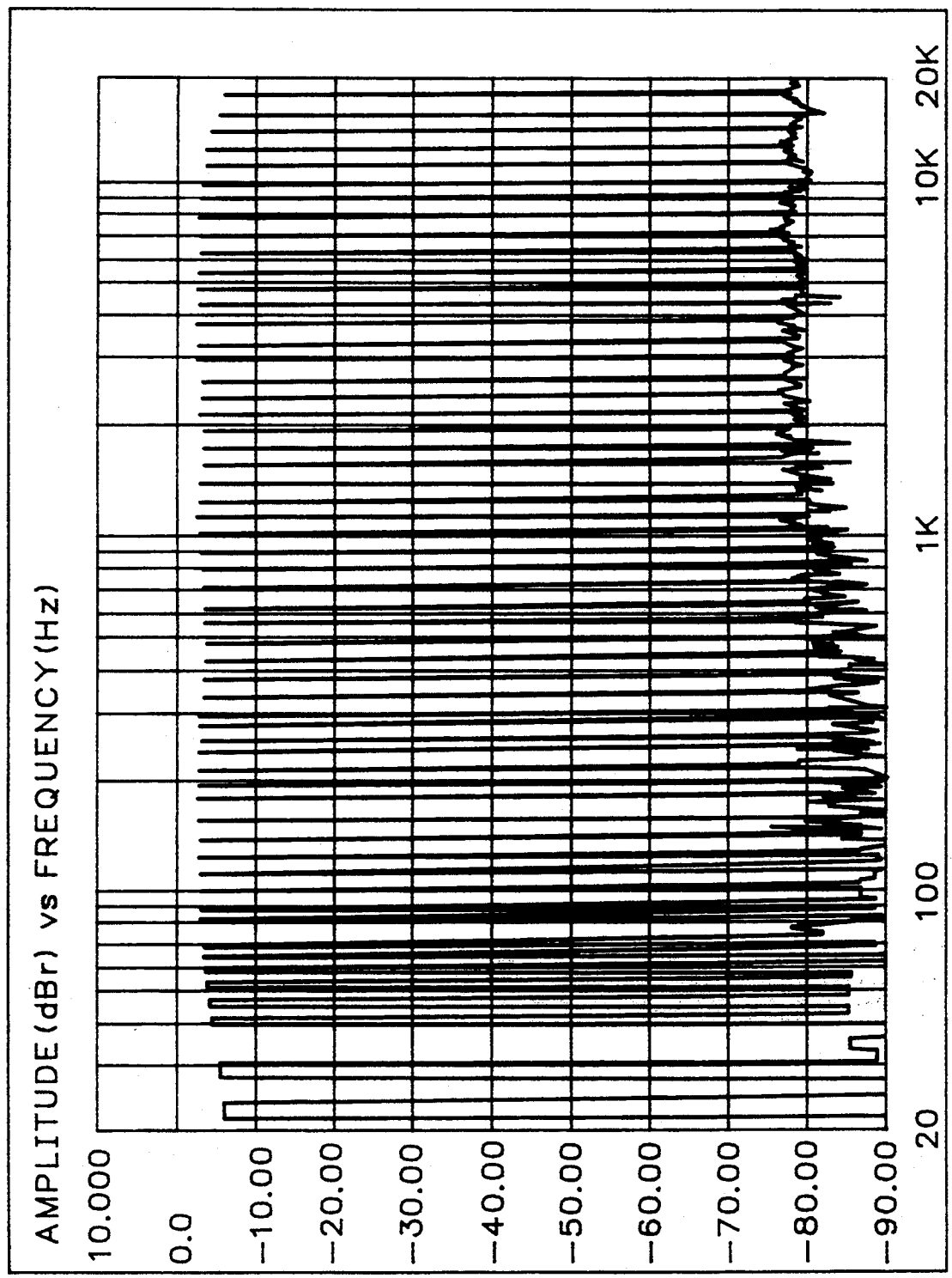
FIG. 6A is a plot of input test tone amplitudes as a function of frequency for a sixty tone test signal.
Figure 6B:
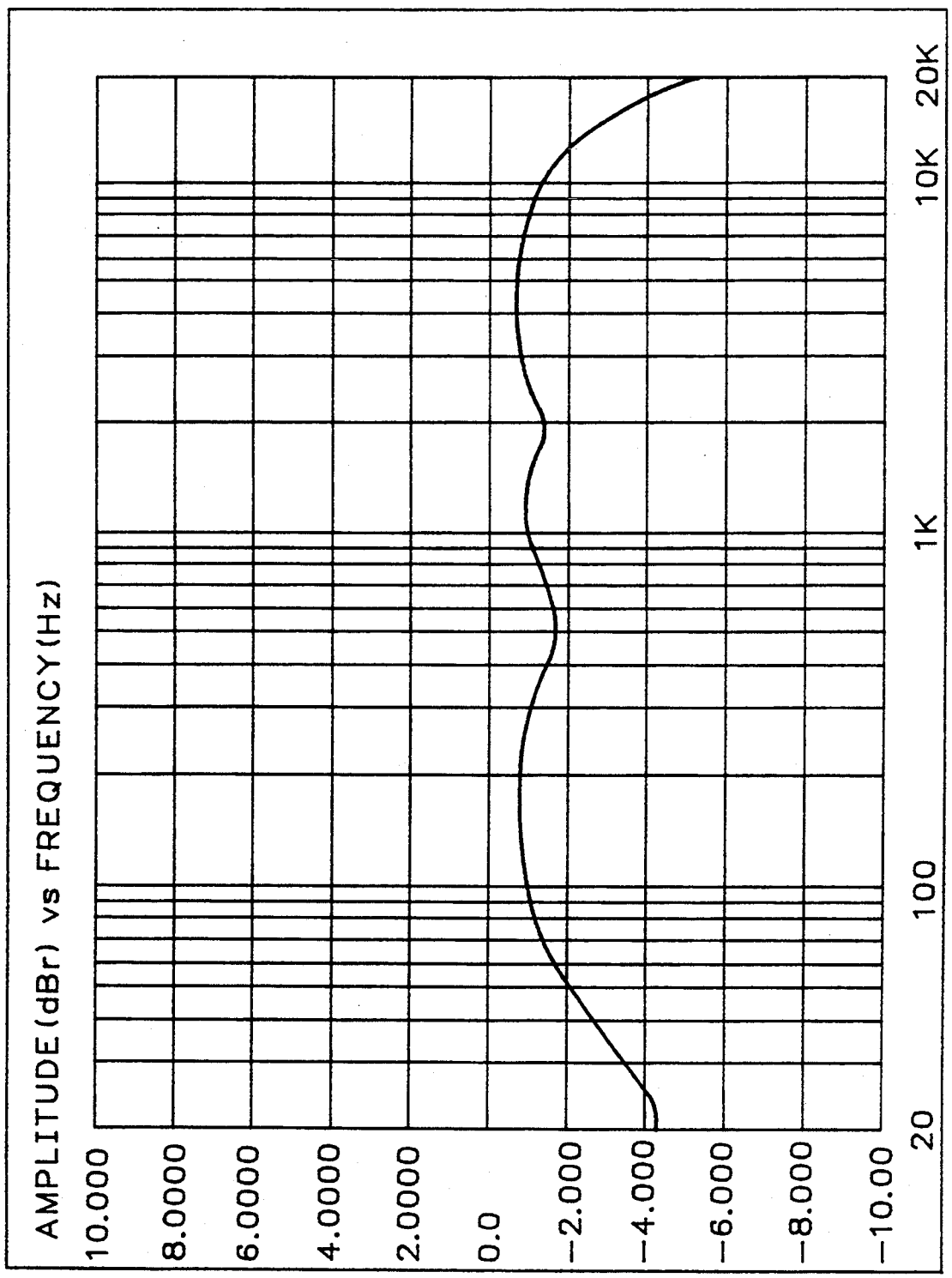
FIG. 6B is a plot of illustrative measured DUT output amplitudes as a function of frequency for a sixty tone test signal.

A commonly known characteristic of an audio transfer device is its frequency response. This is the variation of device gain with frequency. In the present invention, rather than applying a single frequency to the input of the DUT and measuring its amplitude at the output and repeating the process for many different input frequencies, a plurality of frequencies are simultaneously applied to the input, and their corresponding amplitudes at the output are identified by the FFT. In the frequency domain the input would be as shown in FIG. 6A, where the amplitude is plotted as a function of frequency, on a log scale. In this exemplary case, a 60 tone input is employed, though fewer or greater numbers of input tones, or frequencies, may be employed. The amplitude of the output is measured only at the input frequencies, and plotted as a function of frequency, as shown in FIG. 6B. In FIG. 6B the amplitudes of frequencies between those corresponding to the test tones have been interpolated in order to obtain a continuous curve. While interpolation is not necessary, it is desirable because it makes the output easier to read and estimation of amplitudes between the distinct test tones easier.

Figure 6C:
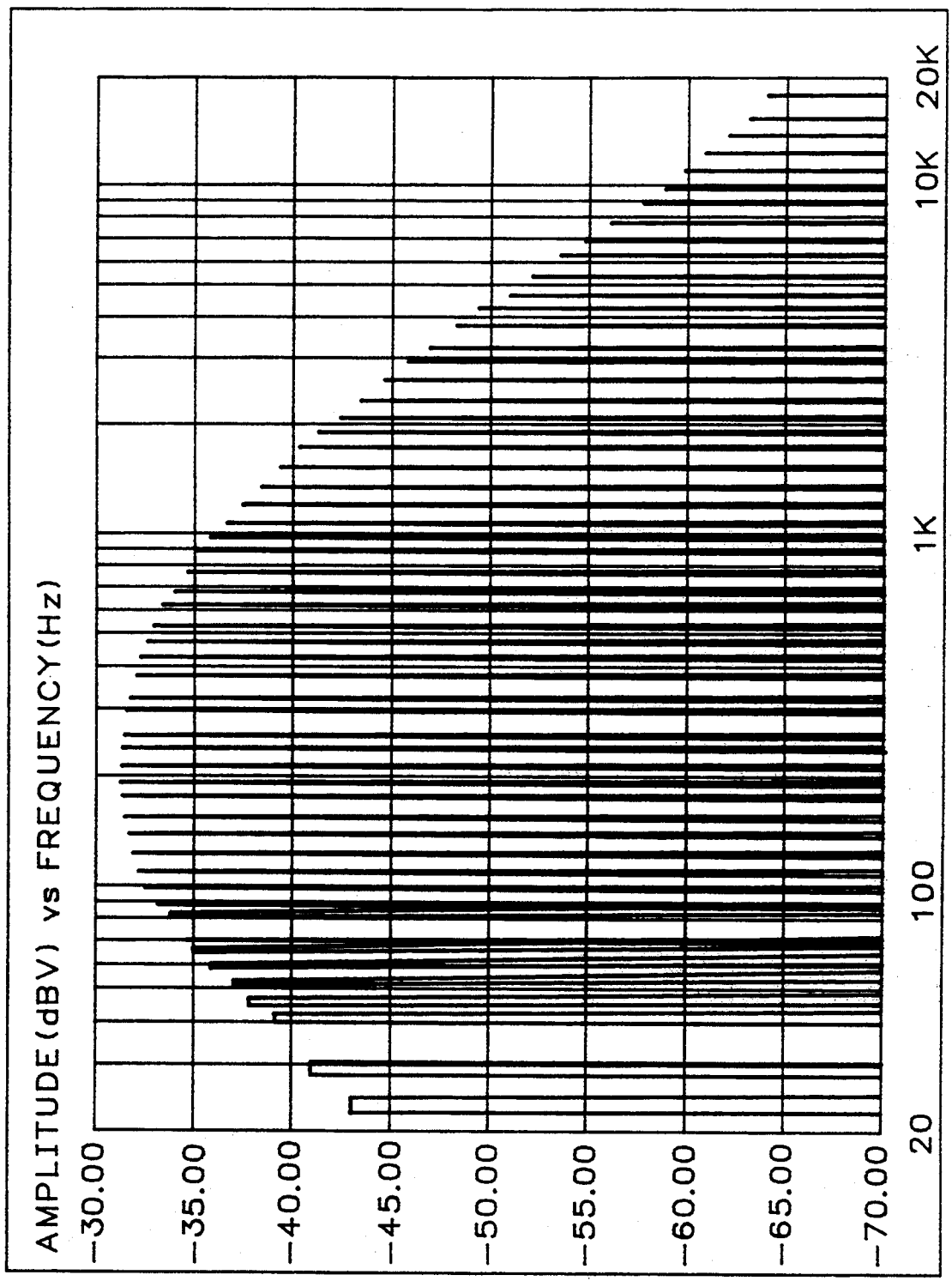
FIG. 6C is a plot of input test tone amplitudes as a function of frequency for a sixty tone test signal, weighted to simulate program material.

In order to measure the frequency response of the DUT under nearly actual operating conditions, the input amplitudes may be weighted as a function of frequency to simulate frequency amplitudes in program material, as shown in FIG. 6C.

Wow and flutter, a type of frequency modulation distortion, is often produced by audio tape players. This has the effect of shifting energy from test tones into side bands of the test tones. The amplitude measurement of the acquired test tone frequency will produce an incorrect value; that is, it will be too low. This problem may be solved by root sum square addition of the tone frequency and its neighboring sidebands.

Figure 7:
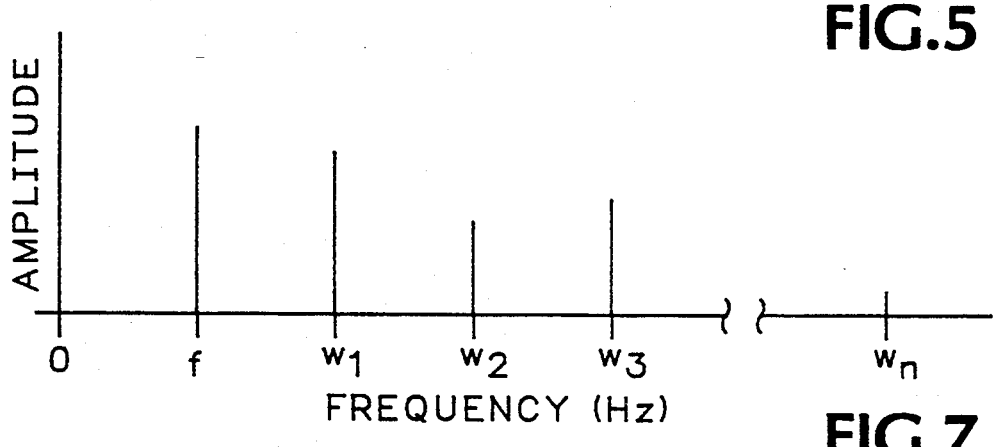
FIG. 7 is a plot of illustrative DUT output amplitudes as a function of frequency when excited with a single sinewave, showing harmonic distortion components to be measured in accordance with the present invention.
Figure 8:
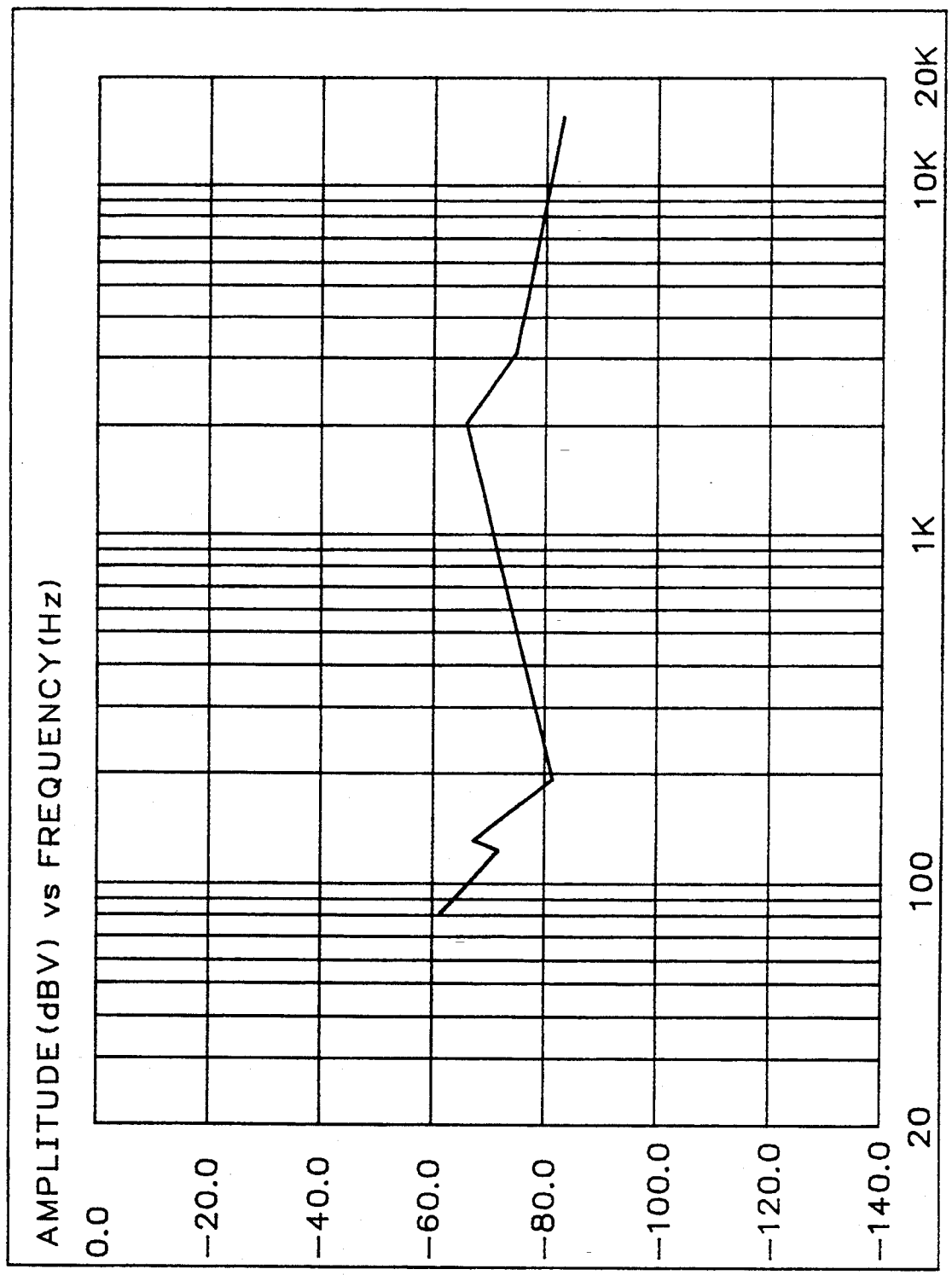
FIG. 8 is a plot of illustrative measured DUT output amplitudes, at harmonic frequencies only, as a function of frequency for a five tone test signal.
Figure 9:
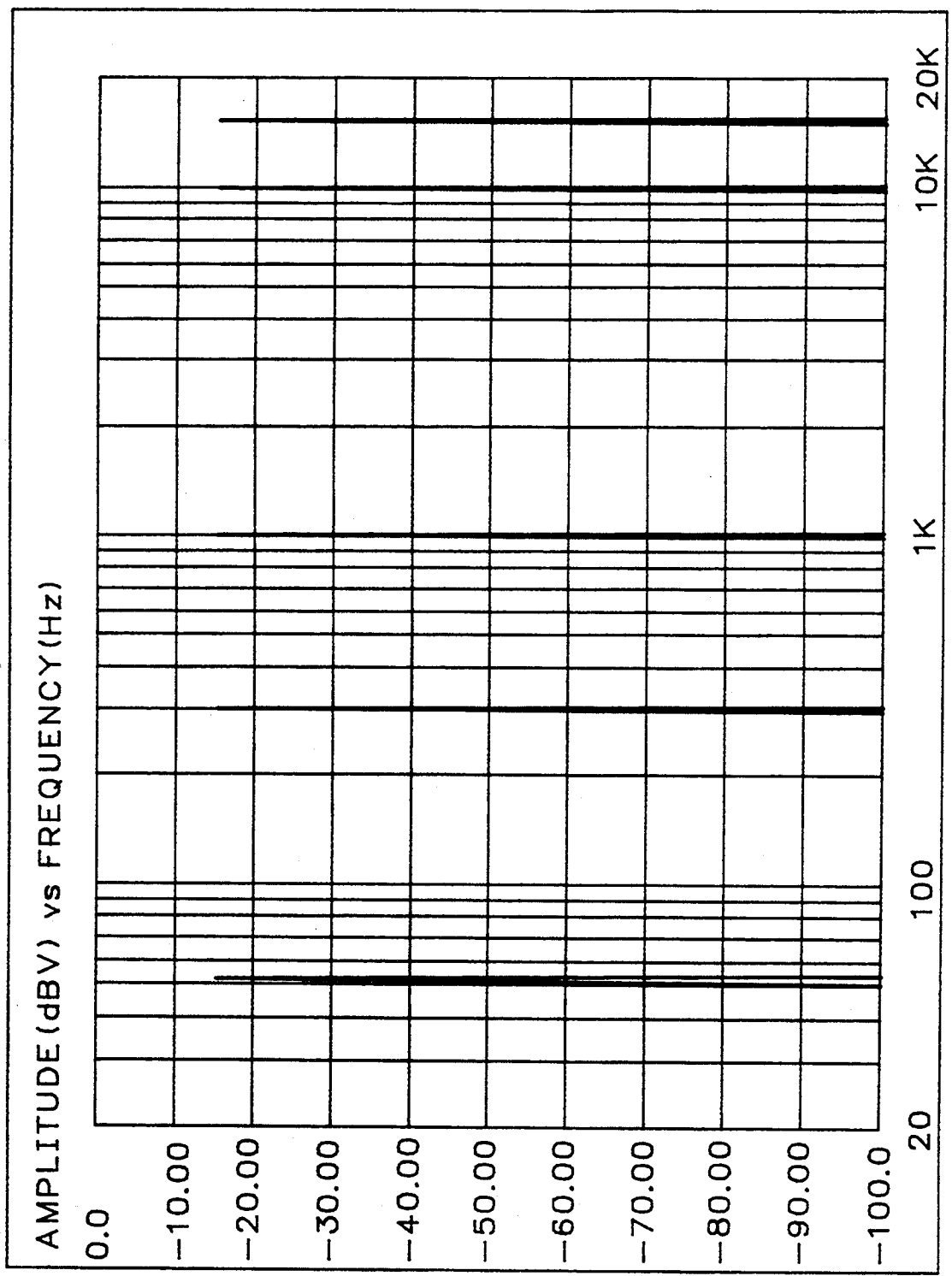
FIG. 9 is a plot of input test tone amplitudes as a function of frequency for a five tone test signal.

Another characteristic of audio signal transfer devices is the extent of harmonic distortion that they produce. In FIG. 7 amplitude is plotted as a function of frequency. An input signal having frequency f is shown, along with its second, third, fourth and highest identified harmonics, $w_1$, $w_2$, $w_3$ and $w_n$. While this represents the output that would be obtained by a single test signal where the device under test produces substantial harmonic distortion, a multitone test signal may be employed with the present invention to obtain a comprehensive harmonic distortion measurement in a short period of time. For example, FIG. 8 shows a plot of output harmonic amplitude as a function of frequency where a five tone test signal, as shown in FIG. 9, has been applied to the input of the DUT. The five test tones are selected to not be integer multiples of each other so that the harmonics of those tones will occur at unique places in the spectrum. A total harmonic distortion (hereinafter "THD") value can be obtained by taking the root sum square of the measured harmonic distortion component output amplitudes; that is:

$$THD = \sqrt{\sum_{o}^{H} A_H^2}$$

where

H=the number of harmonic components, and
$A_H$=the amplitude of a given harmonic component.

If test tones were chosen so that the harmonics were allowed to overlap, it would be possible for harmonics with opposing phases to cancel, thereby producing lowered, incorrect distortion readings. If the DUT has a nonlinearity with a sharp discontinuity, it will generate high order harmonics. Low frequency test signals will then have harmonics which extend all across the audio band. This makes selection of test tones difficult if harmonic overlap is to be avoided. However, most nonlinearities produce a distortion spectrum which falls off with increasing harmonic order. This allows an upper limit on harmonic order to be used to calculate which test tones will cause overlap. Above that limit the amplitude of harmonics are likely to be negligible when compared with the components already included in the output. In FIG. 8 the amplitudes between the various harmonic frequencies actually measured are interpolated to provide a continuous curve.

Figure 15:
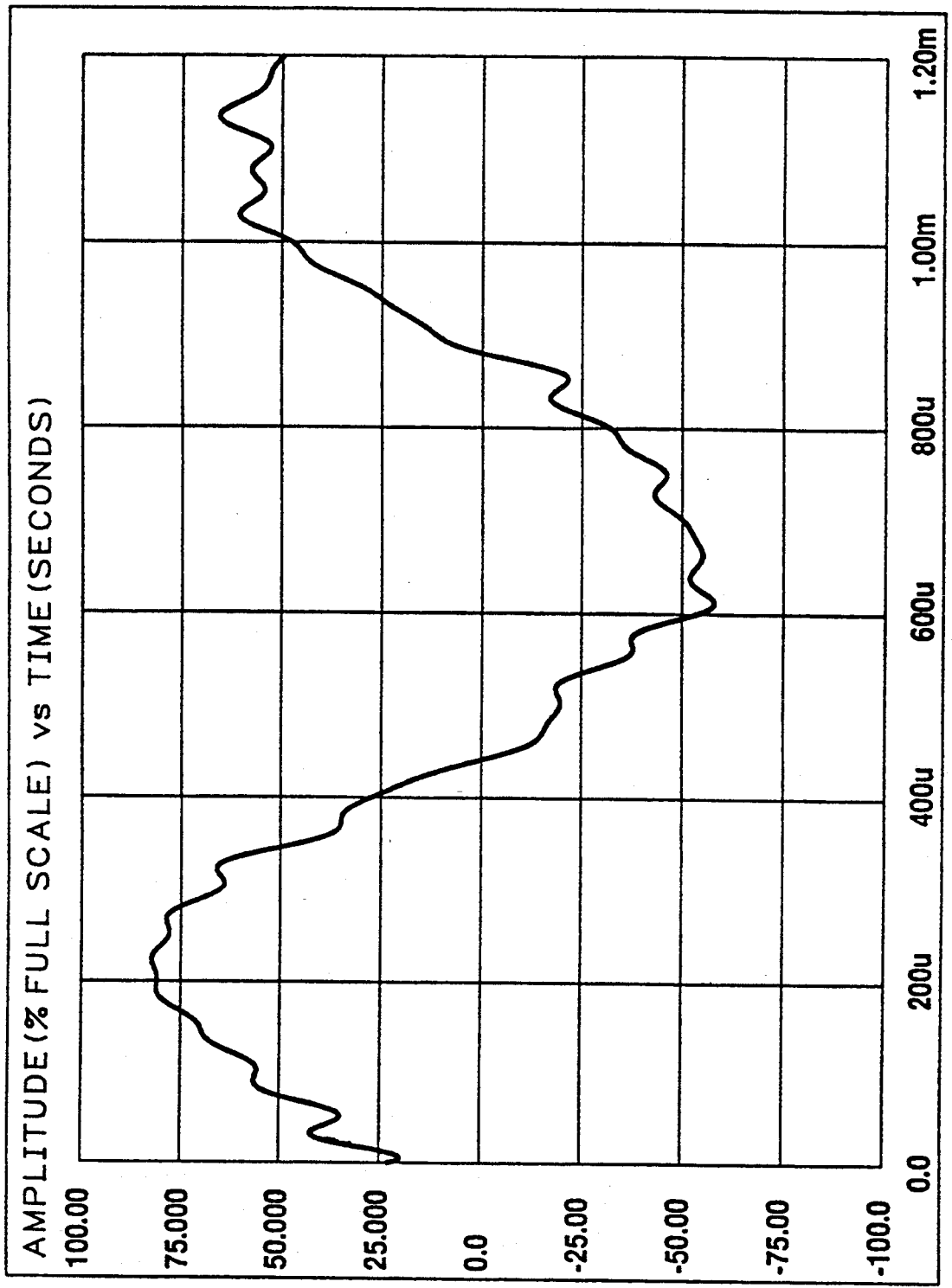
FIG. 15 is a plot of an illustrative DUT output amplitude as a function of time for a multi-tone test signal, where one test tone has an amplitude about 12 dB higher than the amplitudes of the other test tones.

Sometimes it is desirable to make a measurement of the harmonic distortion performance of a device which can be compared to conventional harmonic distortion measurements, yet the fast frequency response and separation measurement capabilities of the present invention are still needed. Raising the amplitude of one test signal frequency component significantly above the others will cause the waveshape and crest factor to be dominated by the larger tone. The harmonics created by the DUT when excited by this signal will be dominated by the harmonics of the larger tone. In practice, an amplitude difference of about 12 dB is sufficient to provide reasonable correlation with single sinewave based measurements in most cases, although some have required a level ratio as high as 30 dB. Such a waveform is illustrated in FIG. 15. When this technique is used, the other test tones may still be used to obtain all other measurement capabilities of the present invention, such as frequency response and channel separation measurements.

Figure 10:
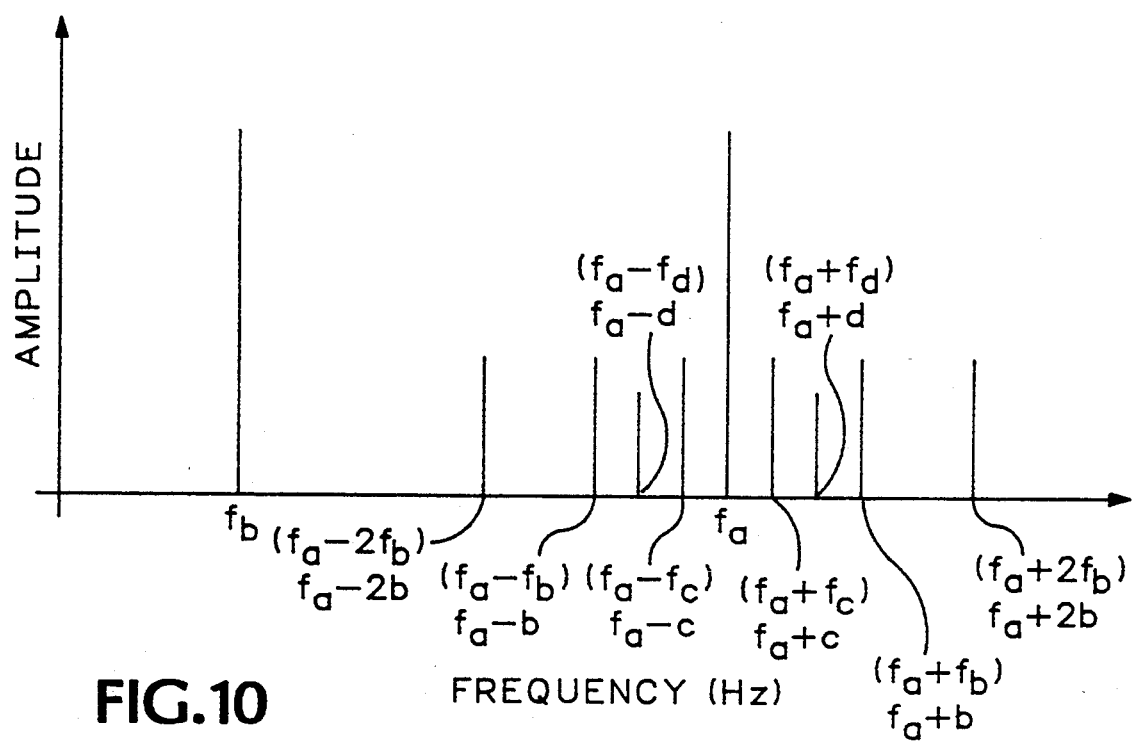
FIG. 10 is a plot of illustrative DUT output amplitudes as a function of frequency, simplified to show only two test tone intermodulation and wow and flutter components to be measured in accordance with the present invention.

Measurement of intermodulation distortion (hereinafter "IMD"), and wow and flutter in the present invention is explained with respect to FIG. 10. In FIG. 10 one frequency of a multitone input signal is shown by $f_b$ and another, higher frequency test tone is represented by $f_a$. Ordinarily there would be more than just those two test tones, but FIG. 10 has been limited to those two tones for purpose of clarity. The higher IMD components are represented by $(f_a+f_b)$, or "$f_{a+b}$", and $(f_a-2f_b)$, or "$f_{a+2b}$". Similarly, the lower intermodulation distortion components are represented by $(f_a-f_b)$, or "$f_{a-b}$", and $(f_a-2f_b)$, or "$f_{a-2b}$". That is, intermodulation between $f_b$ and $f_a$ produces sum and difference frequencies in the output. It is recognized that more distortion products between those two tones may be generated, but only these are shown for the purpose of explanation. Wow and flutter, a type of frequency modulation distortion, is often produced by audio tape players. That also produces distortion components, shown in FIG. 10 as $(f_a+f_c)$, or "$f_{a+c}$"; $(f_a-f_c)$, or "$f_{a-c}$"; or $(f_{a+d})$, or "$(f_a-f_d)$ where $f_c$ and $f_d$ represent wow and flutter frequency components.

If the DUT has nonlinearities, there will be IMD components between all combinations of tone frequencies. By modeling the nonlinearity as a power series, the IMD frequencies can be predicted. These IMD components will appear at frequencies above, below and between the test tones. The calculation of these IMD frequencies becomes very complex when many test tones are included and when the nonlinearity is of a high order. Thence, selection of the test tones must be done carefully.

In applications involving large numbers of test tones, i.e., about 6 or more, the distortion spectrum will become complex enough that although some components may cancel there will be a sufficient number of distortion components remaining that an accurate assessment of nonlinearity may still be made. However, the sheer number of distortion components involved may make the graphing time excessive or the interpretation difficult. By adding all components except the original test tones themselves, a measurement is made which does not suffer from these limitations.

Figure 16A:
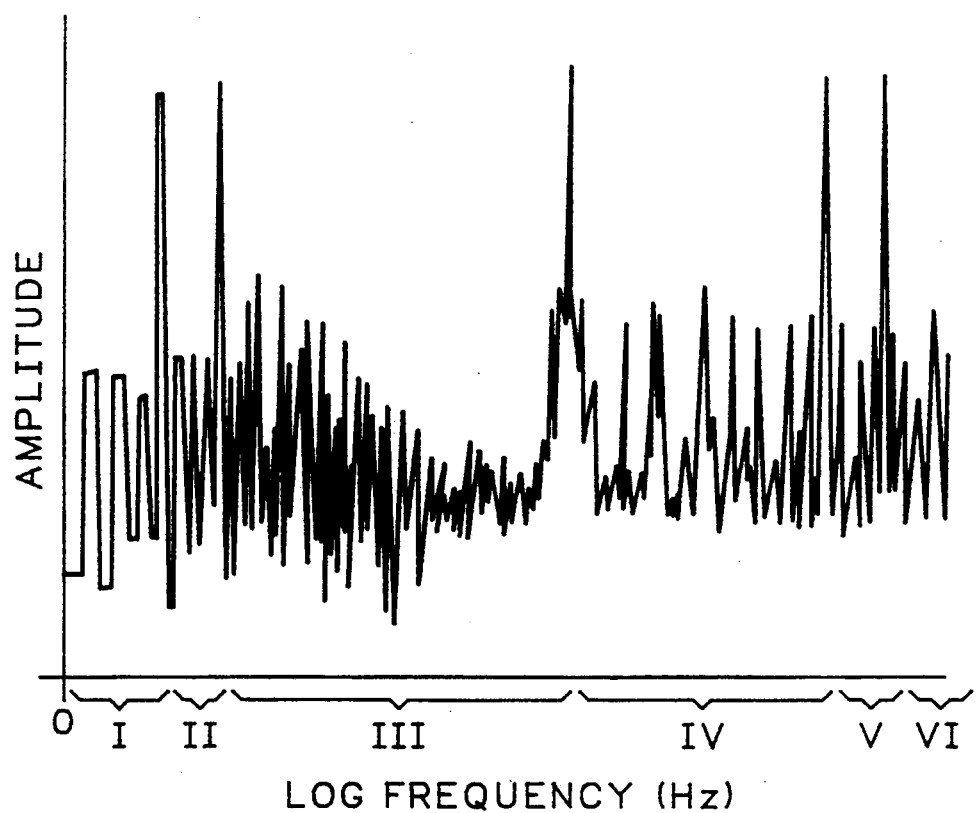
FIG. 16A is a plot of illustrative measured DUT output amplitude as a function of frequency for a five tone test signal input, showing frequency bands, not including the test tones, that are to be root square summed.
Figure 16B:
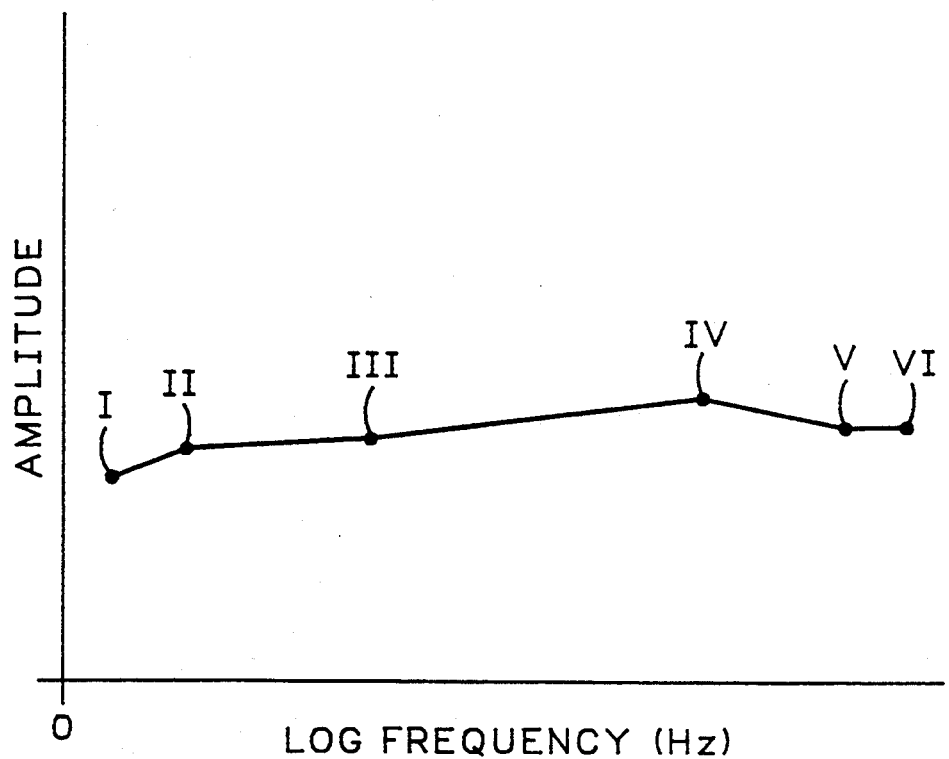
FIG. 16B is a plot of the root square sum values computed for the bands (I, II, III, IV, V and VI) in ranges illustrated in FIG. 16A as a function of the center frequency of the band.

To allow correct summation, a root-sum-square (often called root square summation) technique is used to produce an indication of the effective level in the distortion components. If the measurements are performed using the results of an FFT this merely involves root square summation of the bin levels for all bins excluding those of the original tones. The fact that frequencies are included which may not have distortion components will cause the effects of noise to be included in the measurement. This makes the measurement analogous to the total harmonic distortion plus noise (THD+N) measurement which is commonly performed when using a single sinewave stimulus. Since a multiple sinewave stimulus is used, the measurement will also include intermodulation products and is most accurately called total distortion and noise. If some indication of the distortion variation with frequency is desired, the summation may be done in parts, or frequency bands, as illustrated in FIG. 16A, each band covering a portion of the frequency range, and the sums graphed as a function of the center frequency of that band, as shown in FIG. 16B.

Figure 11:
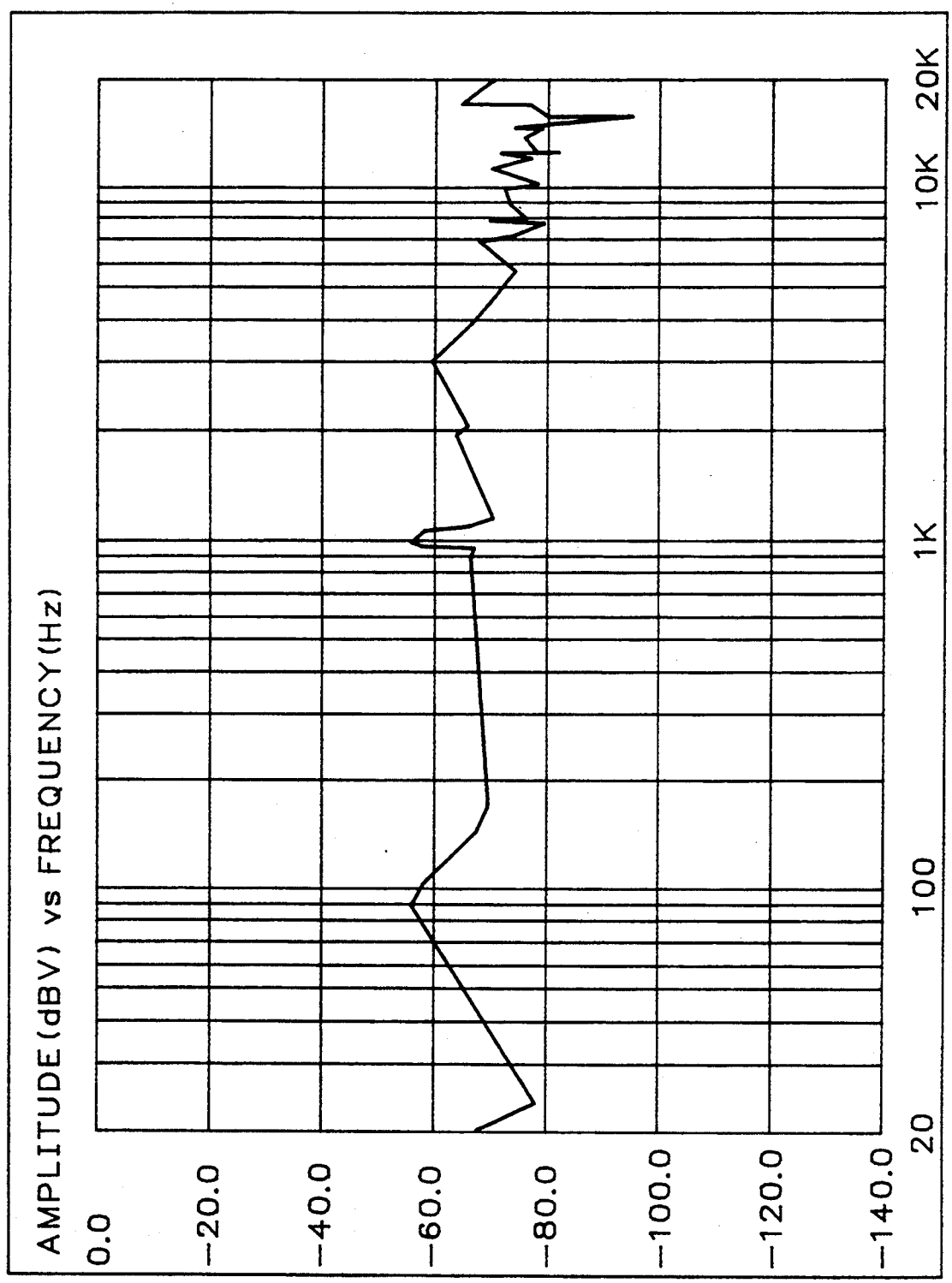
FIG. 11 is a plot of illustrative measured DUT output amplitudes, at intermodulation frequencies only, as a function of frequency for a five tone test signal.

In cases where wow and flutter is not a significant error source in the measurement, a numerical representation of IMD may be obtained by root square sum addition of the components at the intermodulation frequencies. A visual display of IMD is obtained by plotting the amplitudes of the output at IMD frequencies only, as a function of frequency, as shown in FIG. 11. The amplitudes of frequencies between the IMD components are interpolated to provide a continuous curve.

In order to obtain a numerical value representative of IMD when wow and flutter is present, bins located symmetrically on either side of a test tone are summed linearly in pairs, but with a phase inversion of one of the frequency components in each pair. Then the pairs are root sum squared; that is:

$$IMD = \sqrt{\sum_{o}^{N} (A_{UN} - A_{LN})^2}$$

where
  N = the number of sideband pairs, and
  $A_{UN}$ = the upper sideband, and
  $A_{LN}$ = the lower sideband.

The inner subtraction is of the vector amplitudes which include phase information. This produces a value for IMD sidebands, but rejects wow and flutter sidebands in the spectrum measured. This is because the upper and lower wow and flutter sidebands are in phase (so they cancel out when one is inverted), while the upper and lower IMD sidebands are 180° apart in phase (so they add when one is inverted).

To obtain a wow and flutter distortion numerical value, the analysis bins located symmetrically about a test tone are summed linearly in pairs (without inversion of one). Then the pairs are root square summed, thereby canceling out the IMD sidebands in the spectrum measured; that is:

$$W/F = \sqrt{\sum_{o}^{N} (A_{UN} + A_{LN})^2}$$

where
  N = the number of sideband pairs, and
  $A_{UN}$ = the upper sideband, and
  $A_{LN}$ = the lower sideband.

The inner addition is of the vector amplitudes which include phase information.

The distortion measurements obtained by this technique are not directly comparable to those obtained by single sinewave total harmonic distortion plus noise ("THD+N") testing, or by conventional IMD testing. This is because the crest factor, i.e., the ratio of peak to RMS amplitude as illustrated in FIGS. 3A and 3B, of a multitone input signal, will always be higher than that of a single sinewave; that is, for the same peak signal amplitude, the amplitude of each individual tone will be lower than a single sinewave at that tone. However, an accurate and reliable result may be obtained by this technique to provide good comparison of DUT characteristics over time, or to other devices tested by the same technique. It may be desirable to scale distortion measurements by a correction factor to yield readings which are comparable to that obtained with conventional testing for typical DUTs. This can be done by measuring similar DUTs in the conventional way and deriving correction factors by comparing the two sets of measurements.

Figure 12:
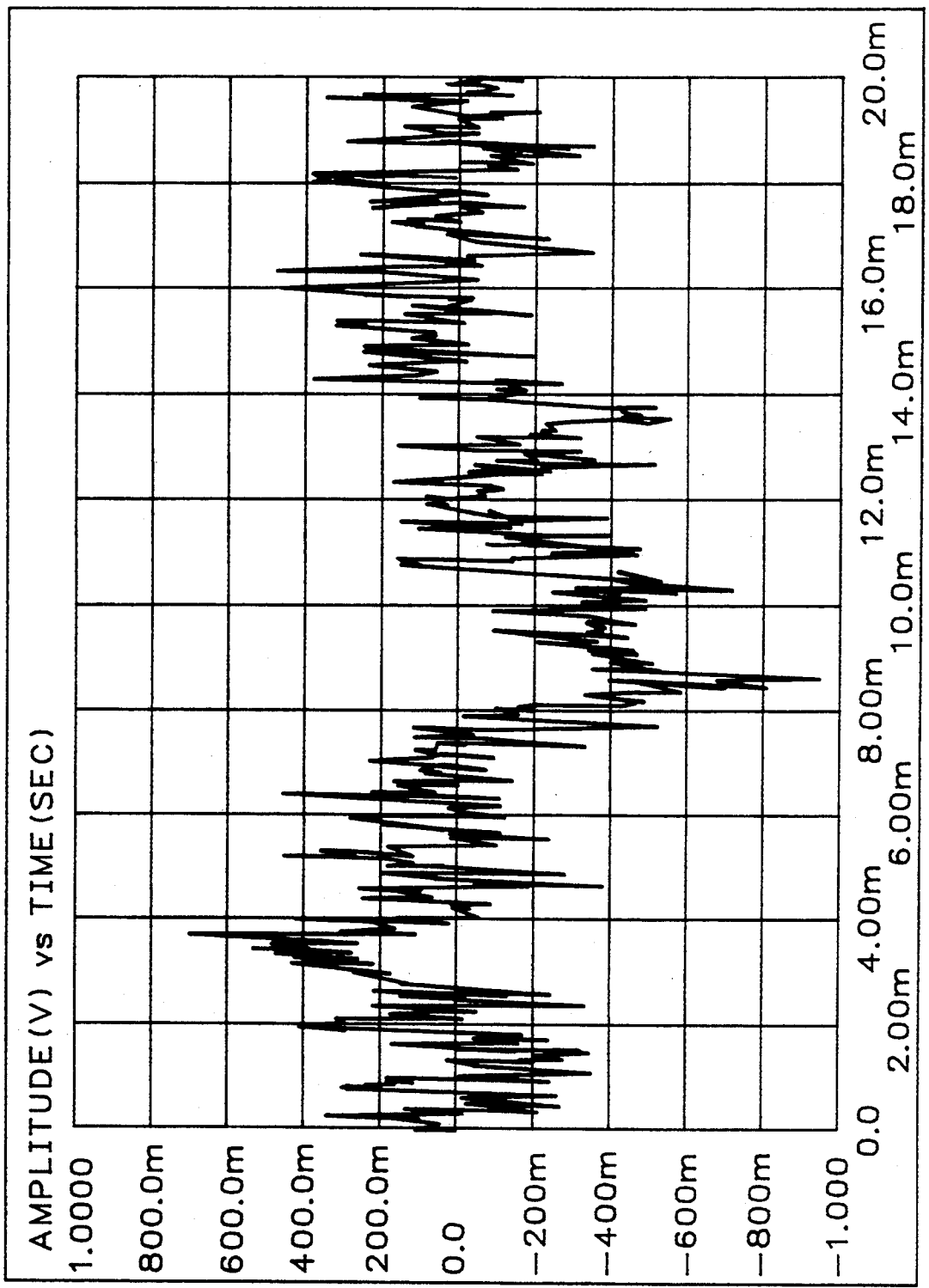
FIG. 12 is a plot of an illustrative DUT input signal amplitude as a function of time, for a sixty tone test signal with randomly selected phase.

In order to minimize the crest factor, and thereby reduce the likelihood of clipping distortion, the test tone signals may be provided with random phases, as shown in FIG. 12 for a sixty tone test signal. Alternatively, the crest factor can be made similar to that of program material by fixing the phase of each of the sinewave components of the input signal to create a test signal with the desired crest factor. This is because, since all the test tones are a multiple of the generation block repetition frequency, their phases are locked together.

Figure 13:
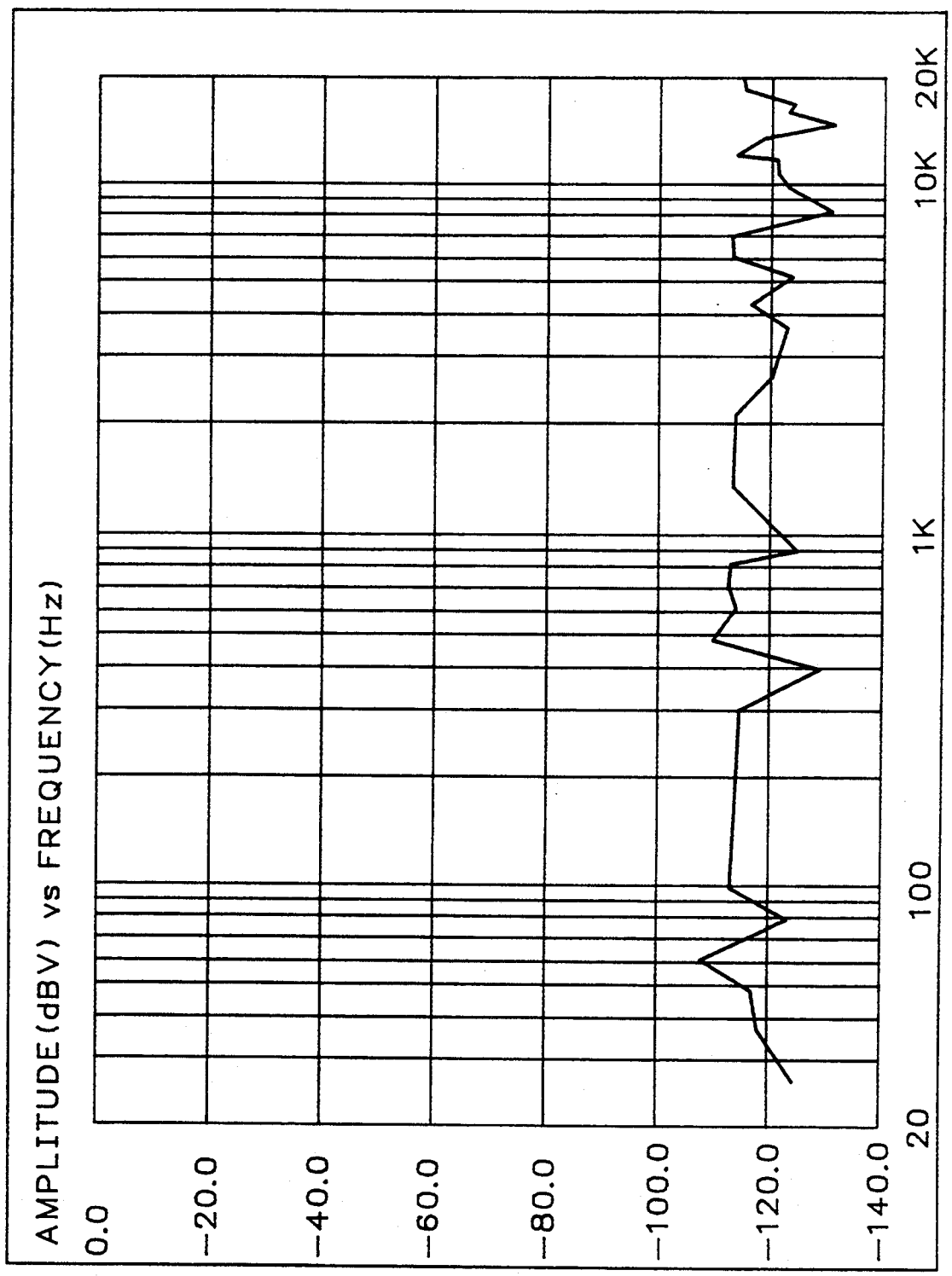
FIG. 13 is a plot of illustrative measured DUT output amplitudes, at selected unused frequencies, as a function of frequency for a five tone test signal.

Noise produced by the DUT may be measured by selecting test tones which leave gaps in the harmonic and intermodulation distortion component spectrum, and measuring the amplitude of the output signal at frequency bins between the test tones and their harmonic and IMD frequencies. A plot of the amplitude values obtained by this technique, as a function of frequency, with interpolation between distinct frequencies, is shown in FIG. 13. A numerical noise value measurement can be obtained by root square summing the amplitudes obtained this way. However, the squared and summed value must be multiplied by a constant representing the number of bins used in the computation, the bandwidth of the bins, and the bandwidth of the measurement to yield an accurate wide band noise figure. The computation is made as follows:

$$\text{Noise} = C_{WG} \times \sqrt{\frac{N_B}{N}} \times \sqrt{\sum_{o}^{N} A_I^2}$$

where
  N = number of bins used in noise calculation,
  $A_I$ = amplitude in bin number N,
  $N_B$ = number of bins across the entire output measurement spectrum; and
  $C_{WG}$ = window gain correction constant, as commonly known in the use of FFTs.

If enough frequency points are used it is possible to factor in weighting filter gain as a function of frequency when computing noise, thereby yielding a weighted noise measurement. This is done by multiplying each $A_I$ by the weighting filter gain at each bin frequency before the squaring and summation in the above equation.

When using signals with a large number of test frequencies it may be difficult to find empty bin frequencies. By making the measurement block length an integer multiple larger than one of the generation block length, there will be additional resolution in the measurement spectrum. This will ensure empty bin frequencies since the generated frequencies, and the resulting harmonic and intermodulation frequencies, must always be an integer multiple of the generation block repetition rate. By making the measurement block length twice that of the generation block length, every alternate frequency bin will be guaranteed to be free of distortion products. Consequently, summing only the alternate bins will result in a noise measurement uncorrupted by distortion.

Applying different test signals to two channels of a stereo DUT allows measurement of channel separation. The two signals may be very nearly identical, but with each missing a few test tones that the other contains across the audio spectrum employed. By measuring the amplitude of those missing tones in the output of the DUT, crosstalk from the opposite channel may be determined. This also allows a quick check for accidental reversal of the channels.

FFT phase values will reflect the phase of each component in the DUT output signal relative to the start of the acquired data. If absolute phase information is desired, it is easily obtained from a single channel of data. The phase of each component in a multitone test signal is known since the waveform is software created and digitally generated. If the test tones have been specified to all be in phase, the measured phase will be the phase shift through the DUT. When measuring audio signal transfer devices that introduce time delay, the delay will be reflected in the measurements. Since the added phase shift will be proportional to the product of time delay and frequency, it is straightforward to compensate for it, if necessary. In situations where the signal generation means and the signal measurement means are co-located, it is possible for the generation means to trigger the acquisition means with the generation of a new time block so as to provide an absolute time reference and enable phase measurements through the device under test without knowing the phase relationship of the original tones. The channel-to-channel phase of a stereo system may be obtained by subtracting the phase data of one channel from the phase data of the other.

Any of the preceding performance measures computed from the spectral characteristics of the DUT output signal, such as harmonic distortion, intermodulation distortion, phase response, etc., may be compared to predetermined maximum or minimum values, or limits, based upon predetermined criteria. This allows "pass/fail" testing of devices to be performed using the fast measurement method described herein.

Since the FFT requires an integral number of cycles during the measurement block, a slowdown or speedup of the test tone signal at the output requires compensation. This can be accomplished in either of two ways.

Figure 14A:
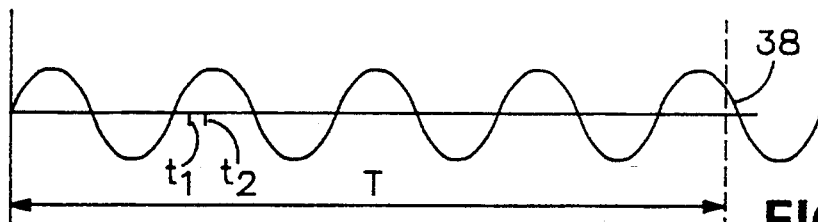
FIG. 14A is an illustration of a DUT output waveform whose period has been lengthened by the DUT.

In FIG. 14A, one frequency of a test signal that has been slowed down by the DUT is shown in relation to the measurement block where the measurement block is equal to the generation block. It can be seen that by restricting the data points to those during the period T a discontinuity exists at point 38. This is recognized by the CPU when the results of the FFT do not fall in the center of a bin. They may even fall in another bin in this situation. However, the data acquired can be compensated by interpolation or by the use of a window.

Where interpolation is to be used, the CPU measures the frequencies in the output signal from the DUT, compares one or more of those frequencies to the frequencies present in the input signal to the DUT, computes a percentage by which the signal is too slow or too fast, and interpolates between the pairs of sampled data by that percentage to get correct values. The FFT is performed again. For example, assume that $t_1$ and $t_2$ represent adjacent samples of the instantaneous amplitudes of the waveform in FIG. 14A. Those amplitudes will each be incorrect for a signal assumed to have an integral number of cycles during period T. The correct value for $t_1$, that is, the value if the signal had not been slowed down, can be computed by interpolating between the amplitudes at $t_1$ and $t_2$ by the appropriate percentage of time and then assigning that amplitude to $t_1$ for purposes of the FFT. This would be repeated for all of the samples during the time period to reconstruct a continuous waveform.

Figure 14B:
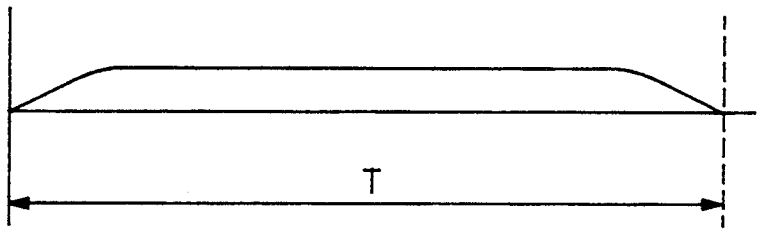
FIG. 14B is an illustration of window waveform.
Figure 14C:
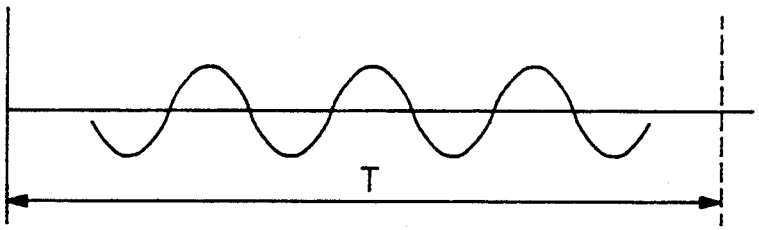
FIG. 14C is an illustration of the product of the window waveform shown in FIG. 14B with the waveform shown in FIG. 14A, as found in accordance with the present invention.

Alternatively, the waveform in FIG. 14A may be multiplied by a window waveform, such as that shown in FIG. 14B. The window waveform has a predetermined shape whereby it starts at zero amplitude at the beginning of period T and ends at zero amplitude at the end of period T. That ensures that the product will also start at zero and end at zero, as shown in FIG. 14C, thereby eliminating the discontinuity. Thereafter, the FFT may be applied to the block of data and the spectral information used as before. A tradeoff in the use of this second technique is that the frequency resolution of the FFT is reduced by the window and this will limit the ability to use closely spaced test tones.

The specific test tones which are to be used may be user selected from those that are allowable (integral multiples of the block repetition frequency, as explained above). Since the block repetition frequency preferably is not an integral number itself, the allowable frequencies, e.g., 17.58 Hz, etc., are unlikely to be intuitive choices of the user. Consequently, the frequencies actually chosen by the user are rounded or truncated to the nearest allowable test tones. For example, 20 Hz would be rounded to 17.50 Hz and 100 Hz would be rounded to 99.62 Hz.

Signals sent from one location to another often need to be identified as to their point of origin. In broadcasting there may be a need to know which of four studios in separate cities is sending a test tone to the receiving transmitter site. In the present invention this identification may be provided by defining a unique combination of test frequencies for each source. Ordinarily it is sufficient to use identical signals for each studio with the addition or deletion of one frequency uniquely for each source. It is also possible, and usually preferable, to keep the amplitude spectra the same and alter the phase of one of the tones in the signal. If there are tones close together in frequency the phase shift of the DUT, e.g., a communications channel from one city to another, may be quantified by these tones and the phase of the information carrying tone is easily recovered.

Figure 17A:
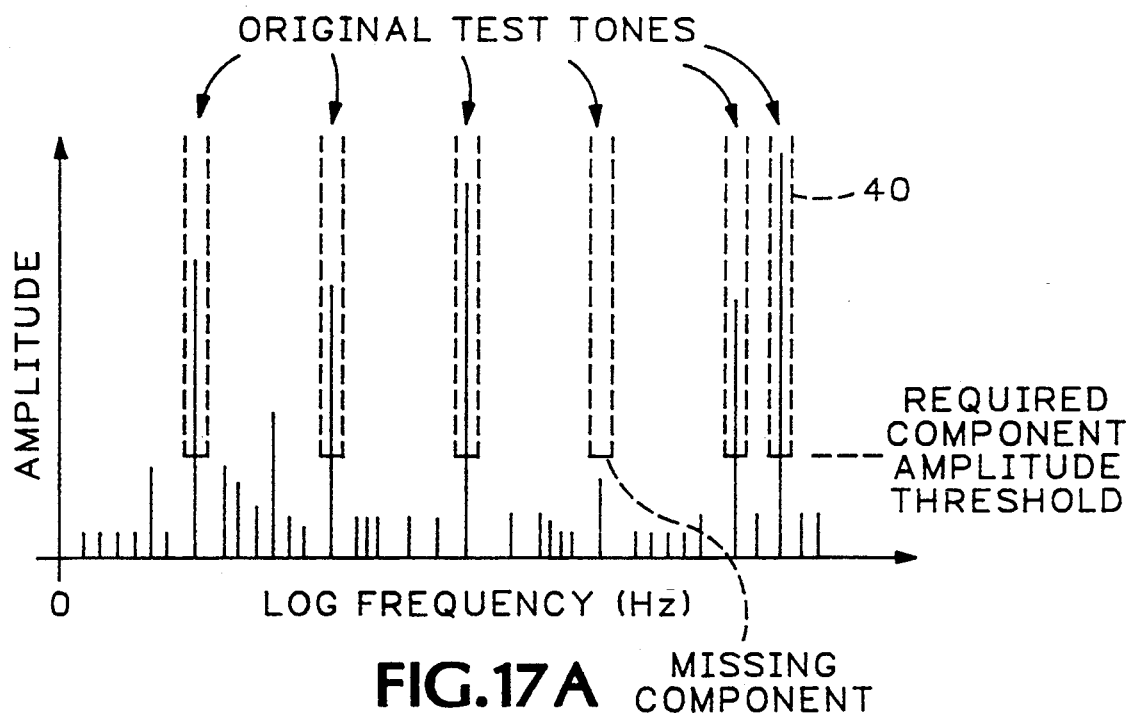
FIG. 17A illustrates the identification of the presence of a pattern of frequency components in the output of a DUT having amplitudes exceeding predetermined required component minimum amplitude thresholds.

It is desirable for the signal generation equipment to be able to insert the test signal into a normally operating audio transmission link and have the measurement equipment automatically detect the presence of the test signal and perform the measurement. To enable this automatic operation, a reliable method of triggering is required which preferably does not add appreciable time to the measurement. Prior art automatic measurement systems have employed a frequency shift keyed ("FSK") tone sequence immediately preceding the test signal to trigger the start of a measurement procedure at the receiving end. In the present invention it is possible for the measurement equipment to sense the presence of the test signal by comparing the received spectrum to a pair of templates whose shapes are determined by the test signal spectrum. This is illustrated in FIGS. 17A and 17B.

The technique requires a minimum percentage of originally generated test signal frequencies to be present in the output signal from the DUT. It is undesirable to require all of the tones to be present since the DUT may have filtered some of them out due to its limited bandwidth or its particular frequency response. FIG. 17A shows a "template" 40 overlayed on a plot of the output spectrum of the DUT to identify tones that should be present. For example, if this minimum percentage had been set at 75%, then 25% of the 6 original test tone frequencies used in FIG. 17A, or 4 original tone frequencies, must exceed the required component amplitude threshold. In actuality, the template is a representation of the digital signal analysis process of checking the FFT data for selected frequency components.

A second part of the technique is to determine how many extra frequency components are present and reject the signal as a test signal if too many extra components are present. An extra frequency component is considered to be present if it exceeds a predetemined amplitude threshold. This allows a few interfering tones as might be present from ac power line hum or video sync buzz to be present in the received signal.

Figure 17B:
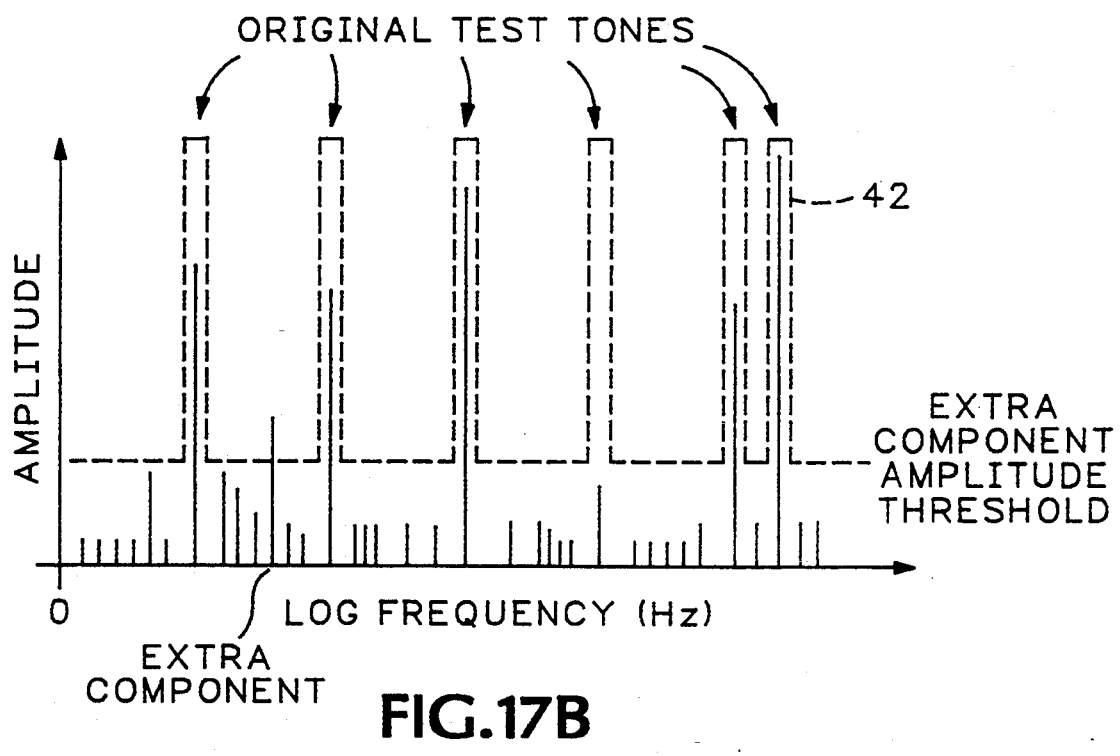
FIG. 17B illustrates the identification of extra frequency components in the output of a DUT having amplitudes exceeding a predetermined maximum threshold.

FIG. 17B shows a template 42 overlayed on the plot of the output spectrum of the DUT to identify frequency or tone components that exceed an amplitude threshold. This threshold would typically be a percentage of the largest component amplitude, for example 1% or −40 dB. A maximum number of such tones would be allowed. The presence of more than this number of tones whose amplitudes exceed the threshold would disqualify the signal. The number might be fixed, for example at 5, or it might be a percentage of the number of original tones, for example 50%. For the example of 6 original tones, a 50% limit would reject any signal which had more than 3 tones whose amplitude exceed the amplitude threshold and whose frequencies were not present in the orignal signal. It is unlikely that program material would have a sufficient number of the required frequencies present and simultaneously have less than the allowable amplitudes of tones to pass both template tests and be mistaken for test signal.

The measurement techniques described thus far herein have required knowledge of the original test signal frequencies. One way to accomplish this is for the values to be programmed into the measurement system when these values are used to specify or create the test signal. However, if the test signal is stored as sample values in memory for later use these frequency values are not necessarily known. This would be the case for a test signal which was recorded on tape for playback testing of another tape recorder or for a signal received over a communications link. Consequently, this invention includes two solutions to this problem.

If the waveform exists in memory as sample values but the original frequency values are no longer available, the original frequency may be obtained for the purposes of the measurements by Fast Fourier Transforming the signal to be generated and identifying all frequency components in the transformed data. This will then be a complete list of the test signal frequencies and will be identical to the original list used to generate the waveform samples.

If the signal is received and the original generated signal is not in memory, as might occur over a communications link or from a test tape, an acceptable estimate of the original frequency list may be obtained by the following method. After an FFT is performed on the acquired signal the largest amplitude frequency component is determined. A prudent range of largest to smallest amplitude for the original tones is assumed. The frequency spectrum is searched for all frequencies which contain more than this minimum amplitude signal. These frequencies are then assumed to be the original tones. The range must not be assumed to be too large or the distortion products in the received signal may be mistaken for test tones. If it is assumed to be too small some original test tones may be missed due to frequency response variations in the DUT. In practice a range of 30 dB is a reasonable compromise between these conflicting requirements.

It is to be recognized that the computations and analyses described herein preferably are made by the CPU 16 in accordance with the instructions of a digital computer program. The CPU may be programmed a variety of different ways, as would be straightforward to a person of ordinary skill in the art.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. Method for measuring the signal transfer characteristics of a signal transfer device under test, said device having an input and an output, comprising the steps of:
   (a) simultaneously applying to said input of said device under test a plurality of selected, distinct, substantially sinusoidal test tones within a selected bandwidth, the test tones having frequencies that are integer multiples of a predetermined frequency, at least one of said test tones having a frequency that is a noninteger multiple of the frequencies of the other said test tones;
   (b) acquiring a signal from said output of said device under test;
   (c) performing a time-to-frequency transform on said acquired signal to obtain the spectral characteristics thereof;
   (d) detecting simultaneously all of the frequency components, and amplitudes thereof, of said acquired signal across said bandwidth, exclusive of the frequencies of said test tones; and
   (e) combining amplitudes of detected frequency components of said acquired signal to obtain a measurement of non-linear effects in said device under test.

2. The method of claim 1 wherein step (e) comprises root square summing said amplitude of detected frequency components in said acquired signal to compute a measurement of total distortion plus noise.

3. An apparatus for measuring the signal transfer characteristics of a signal transfer device under test, said device having an input and an output, comprising:
   (a) application means for simultaneously applying to said input of said device under test a plurality of selected, distinct, substantially sinusoidal test tones within a selected bandwidth, the test tones having frequencies that are integer multiple of a predetermined frequency, at least one of said test tones having a frequency that is a noninteger multiple of the frequencies of the other said test tones;

(b) acquisition means for acquiring a signal from said output of said device under test;

(c) transform means for performing a time-to-frequency transform on said acquired signal to obtain the spectral characteristics thereof;

(d) detection means for simultaneously detecting all of the frequency components, and amplitudes thereof, of said acquired signal across said bandwidth, exclusive of the frequencies of said test tones; and (e) combining means for combining amplitudes of detected frequency components of said acquired signal to obtain a measurement of non-linear effects in said device under test.

4. The apparatus of claim 3, wherein said combining means comprises means for root square summing a plurality of frequency components across a frequency band covering a portion of said bandwidth of said acquired signal to obtain a measurement of total distortion plus noise associated with said frequency band.

* * * * *